US010685919B2

(12) United States Patent
Lamorey et al.

(10) Patent No.: US 10,685,919 B2
(45) Date of Patent: *Jun. 16, 2020

(54) REDUCED-WARPAGE LAMINATE STRUCTURE

(71) Applicant: International Business Machines Corporation, Armonk, NY (US)

(72) Inventors: Mark C. Lamorey, Williston, VT (US); Shidong Li, Poughkeepsie, NY (US); Janak G. Patel, South Burlington, VT (US); Douglas O. Powell, Endicott, NY (US); David J. Russell, Owego, NY (US); Peter Slota, Jr., Vestal, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 168 days.

This patent is subject to a terminal disclaimer.

(21) Appl. No.: 15/426,083

(22) Filed: Feb. 7, 2017

(65) Prior Publication Data

US 2017/0148749 A1  May 25, 2017

Related U.S. Application Data

(63) Continuation of application No. 14/557,795, filed on Dec. 2, 2014, now Pat. No. 9,613,915.

(51) Int. Cl.
*H01L 23/00* (2006.01)
*H01L 23/498* (2006.01)
(Continued)

(52) U.S. Cl.
CPC ........ *H01L 23/562* (2013.01); *H01L 21/4846* (2013.01); *H01L 21/4857* (2013.01);
(Continued)

(58) Field of Classification Search
CPC ............ H01L 23/562; H01L 23/49816; H01L 23/49822; H01L 23/49838;
(Continued)

(56) References Cited

U.S. PATENT DOCUMENTS 4,295,907 A  10/1981  Cordts et al.
5,128,212 A  7/1992  Kneale et al.
(Continued)

FOREIGN PATENT DOCUMENTS

EP  2042655 A1  4/2009
JP  2007041116 A  2/2007
(Continued)

OTHER PUBLICATIONS

Donaldson Company, PTFE Membrane Filter Questions, http://www2.donaldson.com/tetratex/en-uk/pages/about-us/faqs.aspx, pp. 1-2, Accessed on Nov. 17, 2014.
(Continued)

*Primary Examiner* — Peter Dungba Vo
*Assistant Examiner* — Jeffrey T Carley
(74) *Attorney, Agent, or Firm* — L. Jeffrey Kelly

(57) ABSTRACT

A laminate structure includes a conductive layer and a dielectric layer in contact with the conductive layer, the dielectric layer comprises a selectively patterned high-modulus dielectric material that balances a differential stress between the conductive layer and the dielectric layer to mechanically stiffen the laminate structure and reduce warpage.

9 Claims, 7 Drawing Sheets

(51) Int. Cl.
*H01L 21/48* (2006.01)
*H05K 3/10* (2006.01)
*H05K 1/02* (2006.01)
*H01L 23/04* (2006.01)

(52) U.S. Cl.
CPC ........ H01L 23/04 (2013.01); H01L 23/49805 (2013.01); H01L 23/49816 (2013.01); H01L 23/49822 (2013.01); H01L 23/49838 (2013.01); H01L 23/49866 (2013.01); H01L 23/49894 (2013.01); H05K 1/0271 (2013.01); H05K 3/10 (2013.01); H01L 24/16 (2013.01); H01L 24/32 (2013.01); H01L 24/73 (2013.01); H01L 2224/16225 (2013.01); H01L 2224/32225 (2013.01); H01L 2224/73204 (2013.01); H01L 2924/15311 (2013.01); H01L 2924/15747 (2013.01); H01L 2924/181 (2013.01); H01L 2924/3511 (2013.01); Y10T 29/49155 (2015.01)

(58) Field of Classification Search
CPC ......... H01L 23/49866; H01L 23/49894; H01L 21/4846; H01L 21/4857; H01L 2924/15311; H01L 2924/181; H01L 2224/16225; H01L 2224/32225; H01L 2224/73204; H01L 2924/00012; H05K 3/10; H05K 1/0271; Y10T 29/49126; Y10T 29/49155
USPC .......... 29/830, 831, 846, 847; 174/254, 255, 174/260
See application file for complete search history.

(56) References Cited

U.S. PATENT DOCUMENTS

| | | | |
|---|---|---|---|
| 5,319,570 A | 6/1994 | Davidson et al. | |
| 5,665,526 A | 9/1997 | Markovich et al. | |
| 5,868,887 A | 2/1999 | Sylvester et al. | |
| 6,835,897 B2 | 12/2004 | Chang et al. | |
| 7,169,685 B2 | 1/2007 | Connell et al. | |
| 7,319,066 B2 | 1/2008 | Saiki et al. | |
| 7,727,785 B2 | 6/2010 | Connell et al. | |
| 7,892,894 B2 | 2/2011 | Do et al. | |
| 8,022,310 B2 | 9/2011 | Okazaki et al. | |
| 8,053,354 B2 | 11/2011 | Lehr et al. | |
| 8,181,342 B2 | 5/2012 | Chiang et al. | |
| 8,785,787 B2 | 7/2014 | Kouda et al. | |
| 8,975,528 B2 | 3/2015 | Kariyazaki | |
| 9,040,388 B2* | 5/2015 | Blackshear | H01L 21/561 257/678 |
| 9,543,255 B2 | 1/2017 | Lamorey et al. | |
| 2004/0173506 A1* | 9/2004 | Doktycz | B01D 67/0072 210/85 |
| 2007/0213429 A1 | 9/2007 | Cheng et al. | |
| 2009/0107714 A1 | 4/2009 | Ogasawara | |
| 2009/0166892 A1 | 7/2009 | Lee | |
| 2010/0116530 A1* | 5/2010 | Okazaki | H05K 3/4688 174/257 |
| 2010/0210745 A1 | 8/2010 | McDaniel et al. | |
| 2010/0314725 A1 | 12/2010 | Gu et al. | |
| 2011/0061906 A1 | 3/2011 | Cho et al. | |
| 2011/0108982 A1 | 5/2011 | Kim et al. | |
| 2011/0203632 A1* | 8/2011 | Sen | B82Y 10/00 136/244 |
| 2012/0112345 A1* | 5/2012 | Blackwell | H01L 21/4857 257/738 |
| 2013/0043060 A1* | 2/2013 | Allard | H05K 3/4682 174/250 |
| 2013/0105063 A1* | 5/2013 | Dauksher | B32B 37/02 156/64 |
| 2013/0334711 A1* | 12/2013 | Blackshear | H01L 23/145 257/778 |
| 2014/0374914 A1* | 12/2014 | Kim | H01L 23/562 257/773 |
| 2015/0257263 A1 | 9/2015 | Sethumadhavan et al. | |
| 2015/0294932 A1 | 10/2015 | Noh et al. | |
| 2015/0359095 A1 | 12/2015 | Murakawa et al. | |
| 2016/0155708 A1 | 6/2016 | Lamorey et al. | |

FOREIGN PATENT DOCUMENTS

| | | |
|---|---|---|
| JP | 2011198878 A | 10/2011 |
| JP | 2011198878 A5 | 3/2013 |
| WO | 2009131713 A2 | 10/2009 |

OTHER PUBLICATIONS

IBM: List of IBM Patents or Patent Applications Treated As Related (Appendix P), Dated Feb. 14, 2017, 2 pages.

* cited by examiner

REDUCED-WARPAGE LAMINATE STRUCTURE

BACKGROUND

The present invention generally relates to 3D semiconductor packaging, and more particularly to improving the dimensional stability of a laminate structure.

Current semiconductor integrated circuit packaging technologies may use flip chip plastic ball grid array (FCPBGA) laminate substrates to form a grid array of pads on which solder balls may be placed to provide electrical connections to the laminate. Most of these FCPBGA laminate structures may utilize a fiberglass reinforced epoxy core, upon which thin dielectric layers are added and metalized to allow for complex semiconductor wiring from the chip to a printed circuit board.

Over time, the mechanically stabilizing core thickness has been reduced, allowing for improved electrical performance including, for example, reduced inductance and improved power distribution resulting from finer plated-through holes (PTH) ground rules. However, an increase in laminate warpage has been observed, impacting bond and assembly yields. Warpage may include undesired deformations of the laminate substrate caused mainly due to stress induced by aggressive thermal treatments.

In order to minimize the aforementioned problems, coreless laminates may provide a practical alternative. One of the advantages of coreless laminates is that they do not have the limitations of cored laminate structures for conducting wiring through the epoxy core, and thus, take advantage of the resulting higher wiring densities enabled at all levels of the coreless laminates. Consequently, coreless laminates having equivalent electrical function with fewer layers may be produced. However, a trade-off of coreless laminates may be the mechanical integrity of their structure which may make handling a challenging task during both laminate fabrication and subsequent module assembly levels.

SUMMARY

According to one embodiment of the present disclosure, a laminate structure may include: a conductive layer and a dielectric layer in contact with the conductive layer, the dielectric layer may include a selectively patterned high-modulus dielectric material that may balance a differential stress between the conductive layer and the dielectric layer to mechanically stiffen the laminate structure and reduce warpage.

According to another embodiment of the present disclosure, a laminate structure may include: a conductive layer containing a selectively patterned conductive material that may modify a local stress in the laminate structure, and a dielectric layer in contact with the conductive layer, the dielectric layer may include a selectively patterned high-modulus dielectric material that may balance a differential stress between the conductive layer and the dielectric layer to mechanically stiffen the laminate structure and reduce warpage.

According to another embodiment of the present disclosure, a method of forming a laminate structure may include: forming a conductive layer including a conductive material, forming a wiring pattern in the conductive layer, modifying the wiring pattern to modify a local stress in the laminate structure, forming a dielectric layer including a high-modulus dielectric material in contact with the conductive layer, and patterning the dielectric layer to remove portions of the dielectric layer such that remaining portions of the dielectric layer may balance a differential stress between the conductive layer and the dielectric layer to mechanically stiffen the laminate structure and reduce warpage.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
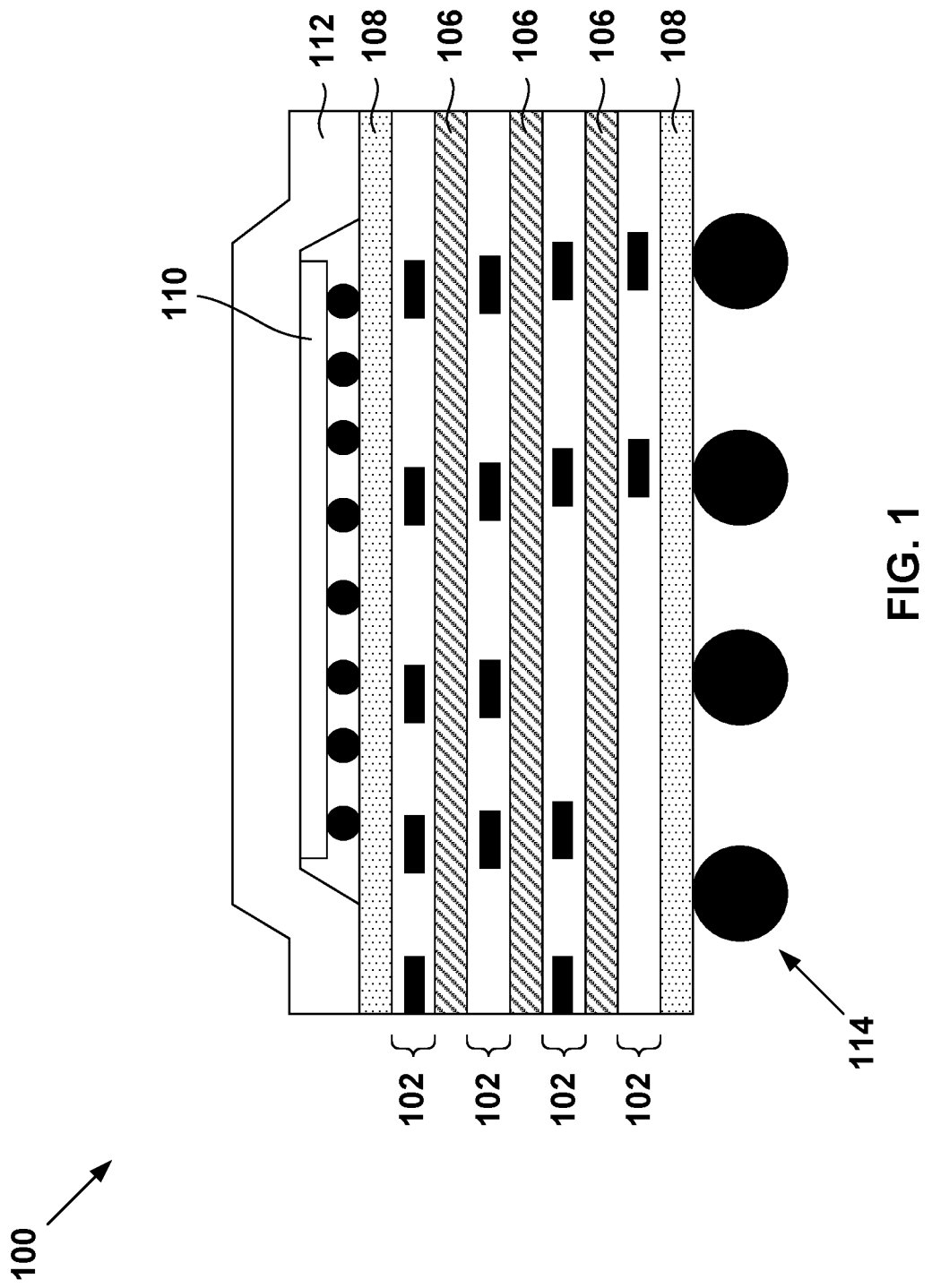
FIG. 1 illustrates a coreless laminate structure including patterned copper layers, according to an embodiment of the present disclosure.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Organic flip chip plastic ball grid array (FCPBGA) packaging is currently an industry standard for single and multichip packaging. Most of these structures utilize a fiberglass reinforced epoxy core, upon which thin dielectric layers are added and metalized to allow for complex semiconductor wiring from the chip into a printed circuit board. Over time, the mechanically stabilizing core thickness has been reduced, allowing for improved electrical performance including, for example, reduced inductance and improved power distribution. As the core thickness is reduced, an increase in laminate warpage has been observed, impacting bond and assembly yields. In order to improve device performance and reduce laminate costs the core may be completely removed from the laminate structure. A coreless laminate design may cause additional bond and assembly challenges that may increase costs associated with tooling and fixturing mainly due to the reduced mechanical strength of the coreless laminate structure.

By modifying individual layers of a flip chip package, embodiments of the present disclosure may, among other potential benefits, provide a more dimensionally stable module that may be compatible with conventional bond and assembly processing, and allow for the fabrication and assembly of a flip chip package using a coreless laminate structure.

The present invention generally relates to 3D semiconductor packaging, and more particularly to improving the dimensional stability of a laminate structure. One way to improve the dimensional stability of the laminate structure may include selective patterning of a copper (Cu) layer to counter the intrinsic forces resulting from a laminate electrical design. One embodiment by which to form the copper layer to improve the dimensional stability of the laminate is described in detail below by referring to the accompanying drawings in FIGS. 1-3. It should be noted that embodiments of the present invention may be applied to laminate structures both with and without a stabilizing core.

Referring now to FIG. 1, a coreless laminate structure 100 is shown according to an embodiment of the present disclosure. The coreless laminate structure 100 may be utilized in, for example, a flip chip plastic ball grid array (FCPBGA) package. The coreless laminate structure 100 may include a plurality of wiring layers 102 (hereinafter "wiring layers"), a plurality of power layers 106 (hereinafter "power layers"), and solder mask layers 108. The wiring layers 102 and the power layers 106 may also be referred to as "conductive layers". The wiring layers 102 may include thin dielectric layers each with corresponding metal traces to allow for complex semiconductor wiring.

The wiring layers 102 and the power layers 106 may typically include a conductive material such as copper that may be patterned during manufacturing according to a predetermined electrical design. The wiring layers 102 may be generally used for signal routing while the power layers 106 may be generally used for power supply namely voltage distribution and ground. It should be noted that the number and configuration of the conductive layers depicted in the figures is for illustrative purposes only, and is not intended to be limiting either as to the application of the invention or its implementation. The coreless laminate structure 100 may include any number of the above layers arranged in any configuration.

The coreless laminate structure 100 may further include a chip 110. The chip 110 may be electrically coupled to the coreless laminate structure 100 using any known solder connection, for example, a control collapse chip connection, as illustrated in the figure. In such cases, the solder may first be applied to one of the two coupled surfaces before they are joined. The coreless laminate structure 100 may further include a lid 112. In one embodiment, the lid 112 may include any material that provides mechanical stiffness and physical protection to the underlying components, such as, for example, nickel plated copper, anodized aluminum, a ceramic, or any other suitable material. In some embodiments, a plurality of solder balls 114 may be used to electrically couple the coreless laminate structure 100 to, for example, a printed circuit board (not shown).

Figure 2:
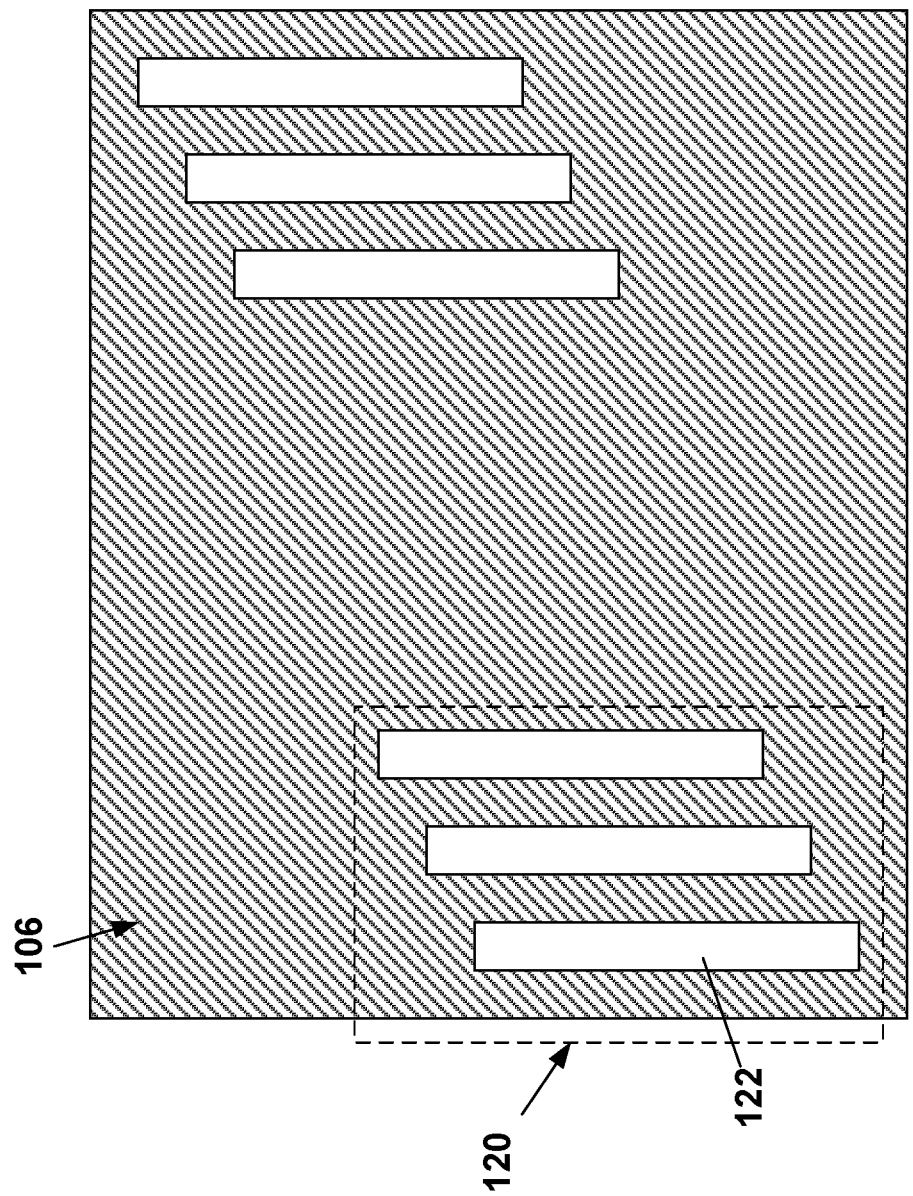
FIG. 2 illustrates a top down view of a power layer after copper patterning, according to an embodiment of the present disclosure.
Figure 3:
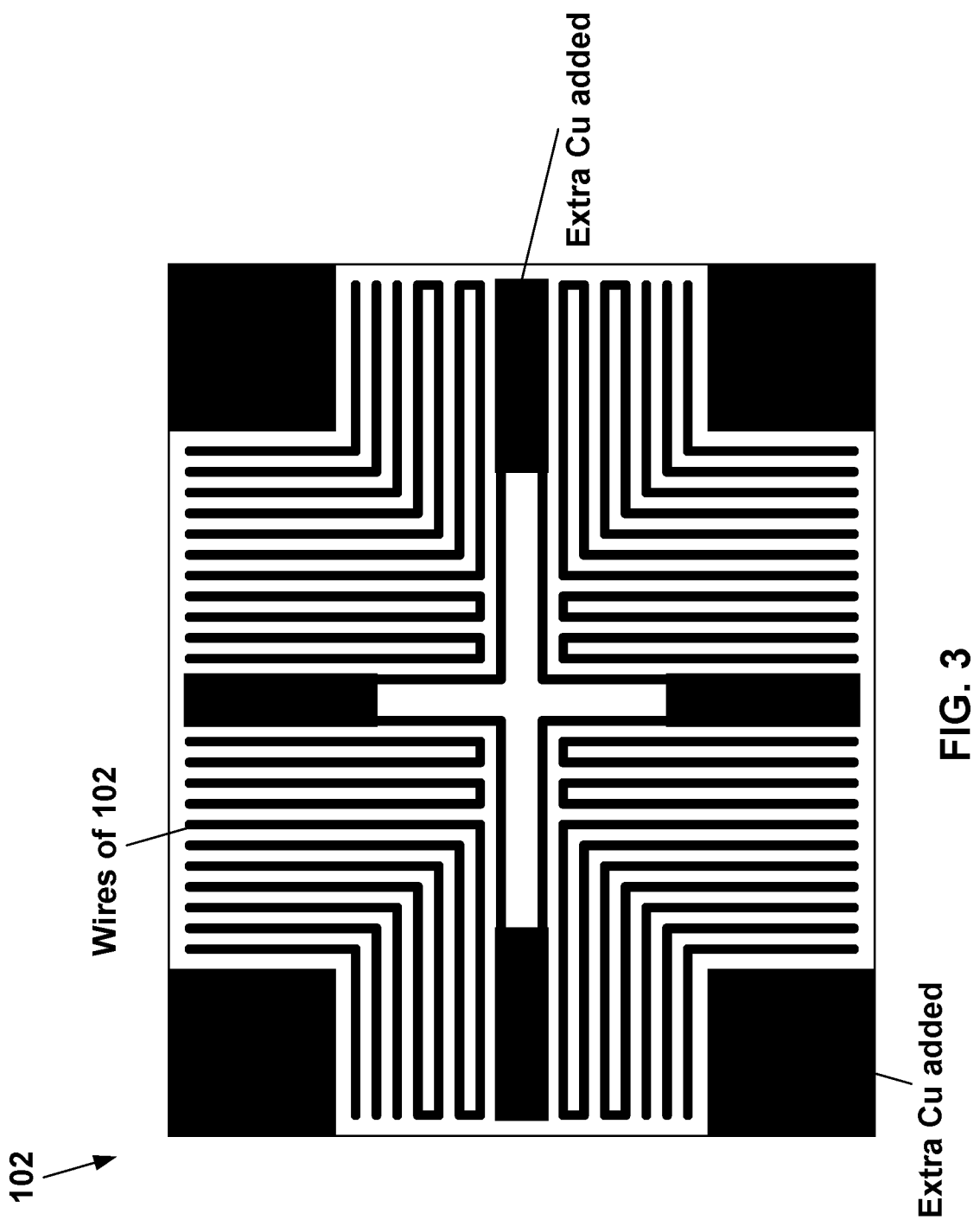
FIG. 3 illustrates a top down view of a wiring layer after copper patterning, according to an embodiment of the present disclosure.

According to the present embodiment, selective patterning of a copper layer or zone (e.g. wiring layers 102 and/or power layers 106) may be conducted to counter the intrinsic forces that may result from the laminate electric design. More specifically, selective patterning of the wiring layers 102 and/or the power layers 106 may be performed to modify local stress in the coreless laminate structure 100. Selective copper patterning may include adding or subtracting copper in selected areas of the wiring layers 102 and/or the power layers 106 according to a predetermined pattern layout in order to specifically tune a stiffness of the conductive layers. For example, in one embodiment, copper may be removed from the power layers 106 and added to the wiring layers 102 to balance a stress in the laminate structure. For example, FIG. 2 is a top view of a power layer 106 after copper patterning. A pattern 120 may be formed in the power layer 106. The pattern 120 may include a plurality of voids 122 caused by selective copper removal from the power layer 106. The pattern 120 may correspond with a predetermined electrical design to achieve the desired net stress in the coreless laminate structure 100. For example, FIG. 3 is a top view of a wiring layer 102 after copper patterning. As depicted in the figure, supplemental copper has been added to the design of the wiring layer 102. The supplemental or extra copper (Cu) added may correspond with a predetermined electrical design to achieve the desired net stress in the coreless laminate structure 100.

By selectively increasing or decreasing the amount of copper in the wiring layers 102 and/or the power layers 106, a coefficient of thermal expansion (CTE) for the entire structure may be modified to reduce thermal warpage in the coreless laminate structure 100.

For example, modifying the wiring pattern 102 by adding or subtracting an amount of the conductive material in the wiring pattern 102 can be done according to a predetermined electrical design such that a coefficient of thermal expansion of the coreless laminate structure 100 is modified to achieve a desired net stress in the coreless laminate structure 100.

It should be noted that, patterning of conductive layers may have a more significant effect on strengthening the laminate structure to reduce warpage than the actual amount of copper in the conductive layers, mainly because copper patterning may control the directional stiffness of the conductive layers. For example, in a power layer 106 including a pattern of parallel lines, the power layer 106 may be stiffer in the direction of the lines as opposed to in the direction perpendicular to the lines, regardless of the size of the lines (e.g. amount of copper). The copper design may allow for steering of stress/strain and selective relaxation of stress/strain in a managed fashion so that warpage may be reduced.

Patterning in the wiring layers 102 and/or the power layers 106 may be conducted in a way such that it enables the coreless laminate structure 100 to be electrically functional, for example, by appropriate routing of signal wires and location of power distribution planes. Once the coreless laminate structure 100 is electrically functional, there may be some flexibility to add additional copper by connecting it to ground planes (not shown). It should be noted that the selective copper patterning and the addition of supplemental copper may be established during the design phase of the coreless laminate structure 100.

Selective copper patterns in laminate structures may be typically formed by semi-additive pattern plating. In this process, a thin layer of electroless copper may be deposited over an entire substrate surface, a photo-resist may then be employed to define the conductive pattern, and then a thicker copper layer may be electrolytically plated using the electroless copper layer as a connecting layer. After copper plating, the photo-resist may be removed and the electroless copper layer may be etched. It may be understood that areas in the laminate structure that are not plated may be subsequently filled with a dielectric material.

Figure 4:
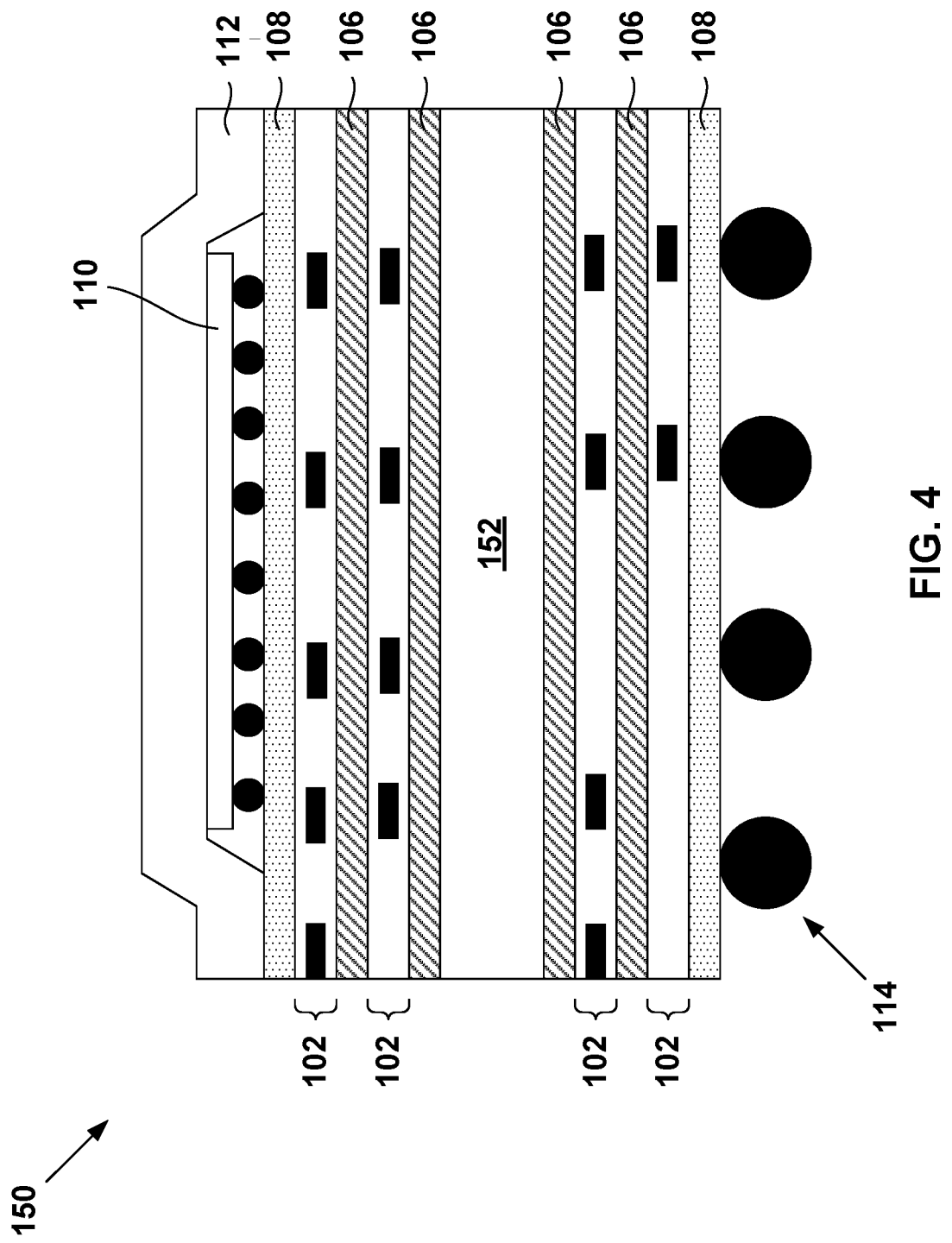
FIG. 4 illustrates a thin-core laminate structure including patterned copper layers, according to an embodiment of the present disclosure.

It should be noted that the selective patterning of the conductive copper layers (e.g. wiring layers 102 and power layers 106) may also be conducted in a thin-core FCPBGA such as the thin-core laminate structure 150 shown in FIG. 4. The thin-core laminate structure 150 may include a core layer 152. The core layer 152 may include for example, a glass reinforced epoxy with a thickness varying from approximately 30 µm to approximately 1500 µm. It may be understood that the process of selective copper patterning in the thin-core laminate structure 150 may include similar steps and may be performed in a similar fashion as the selective copper patterning process in coreless laminate structures described above.

Another way to improve the dimensional stability of the laminate structure may include selectively patterning one or more layers of a high-modulus dielectric layer at selected locations within the laminate structure. One embodiment by which to incorporate one or more selectively patterned high-modulus dielectric layers is described in detail below by referring to the accompanying drawings in FIGS. 5-7. As above, it should be noted that embodiments of the present invention may be applied to laminate structures both with and without a stabilizing core.

Figure 5:
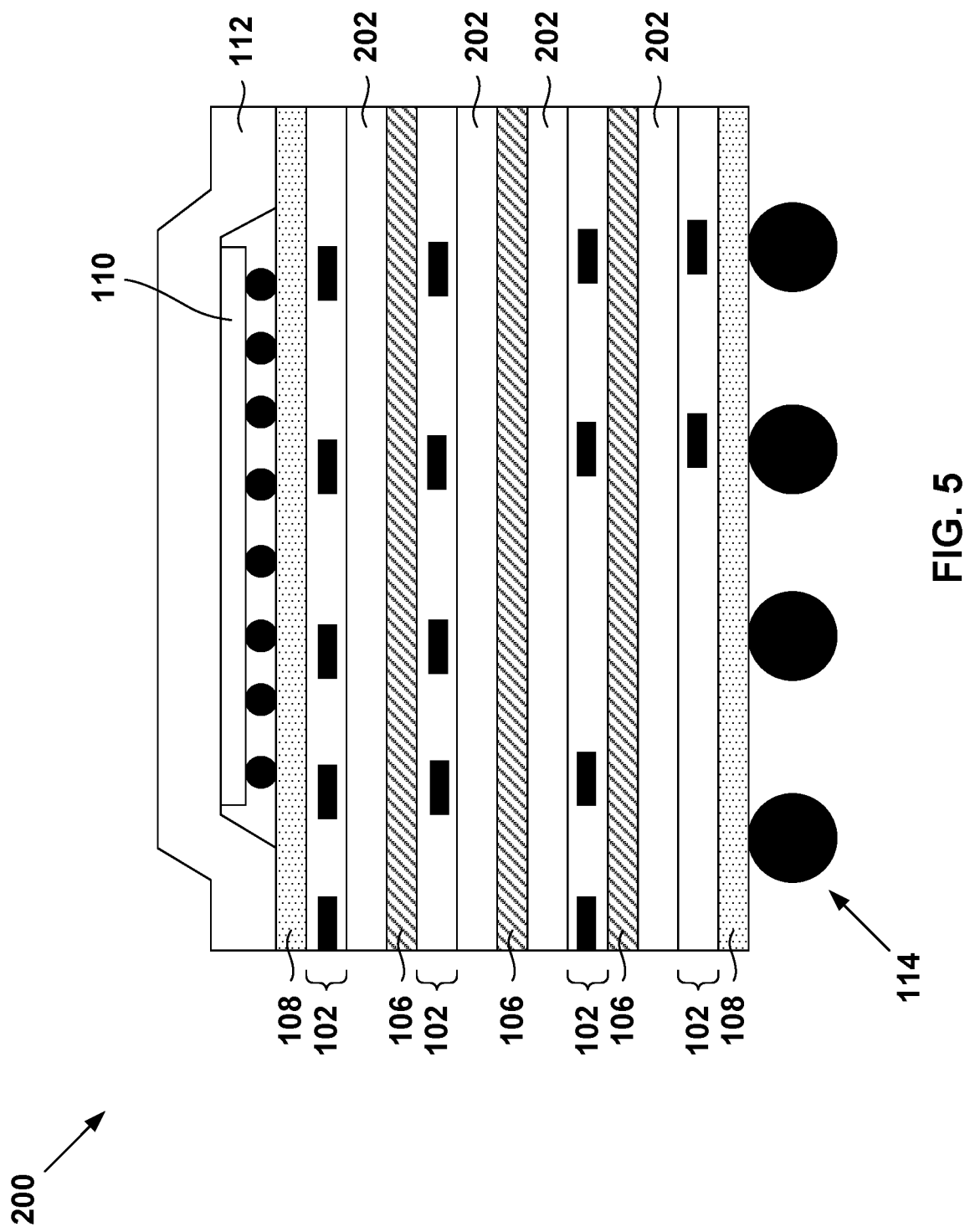
FIG. 5 illustrates the coreless laminate structure including a high-modulus dielectric layer, according to an embodiment of the present disclosure.

Referring now to FIGS. 5, a coreless laminate structure 200 is shown according to an embodiment of the present disclosure. The coreless laminate structure 200 may include substantially similar components as the coreless laminate structure 100 described above with reference to FIG. 1, including selectively patterned conductive copper layers.

The high-modulus dielectric layer 202 may be located in selected areas of the coreless laminate structure 200 to mechanically enhance the coreless laminate structure 200 thereby increasing laminate stiffness and counterbalancing intrinsic stress forces that may cause warpage. The high-modulus dielectric layer 202 may include a high-modulus fiber material that may reinforce the dielectric matrix increasing the stiffness of the coreless laminate structure 200. Additionally, the low CTE of the high-modulus dielectric layer 202 may reduce the composite CTE of the coreless laminate structure 200.

Figure 6:
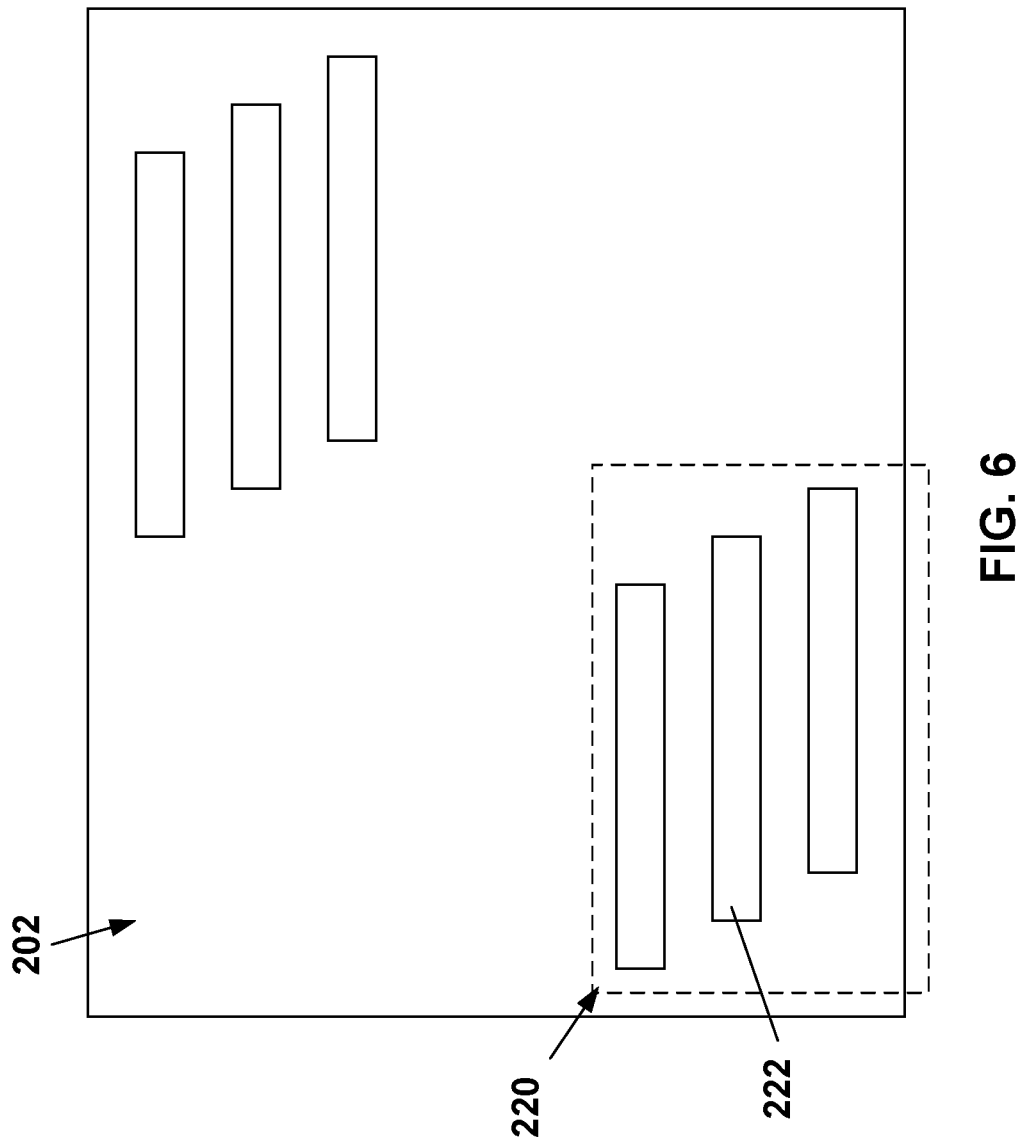
FIG. 6 illustrates a top down view of the high-modulus dielectric layer after patterning of a dielectric material, according to an embodiment of the present disclosure.

The patterning of the high-modulus dielectric layer 202 may be conducted to complement a predetermined copper wiring pattern of the conductive layers (e.g. wiring layers 102 and power layers 106) such that the selective pattern of the high-modulus dielectric layer 202 may counter intrinsic stress forces caused by cure shrinkage and/or differential CTE that may result in increased laminate warpage. More specifically, patterning the high-modulus dielectric layer 202 may include removing portions of the high-modulus dielectric layer 202 from selected areas of the laminate structure such that the remaining portions of the high-modulus dielectric layer 202 balance a differential stress between the conductive layers and the high-modulus dielectric layer 202 to mechanically stiffen the laminate structure and reduce warpage. For example, FIG. 6 is a top view of the high-modulus dielectric layer 202 after patterning. A pattern 220 may be formed in the high-modulus dielectric layer 202. The pattern 220 may include a plurality of voids 222 caused by selective removal of the high-modulus dielectric material from the high-modulus dielectric layer 202. The pattern 220 may balance the differential stress between the patterned conductive layers described above with reference to FIGS. 1-3 and the high-modulus dielectric layer 202.

It should be noted that the Young's Modulus of copper is usually 5 to 10 times higher than that of most dielectric materials. As a result, regions with more copper may usually show higher stiffness, however the continuity of copper may also affect the overall stiffness. For example, a power layer 106 with a continuous block of copper may have higher effective stiffness than a power layer 106 with many small fragments of copper, even the overall copper density is the same for both cases. Differences between copper density and copper continuity may cause thermal stress and in turn leads to unfavorable warpage. In order to balance such differential stress, the high-modulus dielectric layer 202 is applied in a side where the effective stiffness may be lower, so that the stiffness difference caused by copper density may be mitigated by the high-modulus dielectric layer 202.

The high-modulus dielectric layer 202 may include any dielectric material with an improved elastic modulus (e.g. 3X modulus and/or 0.5X modulus with low CTE) and imaging properties. It should be noted that the imaging properties of the dielectric material may be used to defined the pattern of the high-modulus dielectric layer 202.

In one embodiment, the high-modulus dielectric layer 202 may include any photoimageable dielectric material. The photoimageable dielectric material may include negative acting photosensitive materials which cure upon exposure to light within a specified spectral range, similar to many photoresist materials known in the art. In negative acting photosensitive materials, the material may be cross-linked to an increase in the molecular weight which may render it insoluble by light, such as a mercury arc lamp using a glass mask as a patterning tool, or a laser using direct imaging. The pattern may be created to expose the photoimageable dielectric material in places where the material may remain. The un-cross linked photoimageable dielectric material may be removed by dissolving it in any developer solution known in the art.

In another embodiment, the high-modulus dielectric layer 202 may include a laser imageable dielectric material. The laser imageable dielectric material may include positive acting photosensitive materials. In positive acting photosensitive materials, the material applied may have a sufficiently high molecular weight to render it insoluble in a defined developer solution. The laser imageable dielectric material may be able to undergo de-polymerization when exposed to light (from a mercury arc lamp through a mask or by a laser) such that it may become soluble in the developer solution. In the case of positive photo-resist materials, the material may be completely exposed to form the pattern, including places where the laser imageable dielectric material may not remain.

Figure 7:
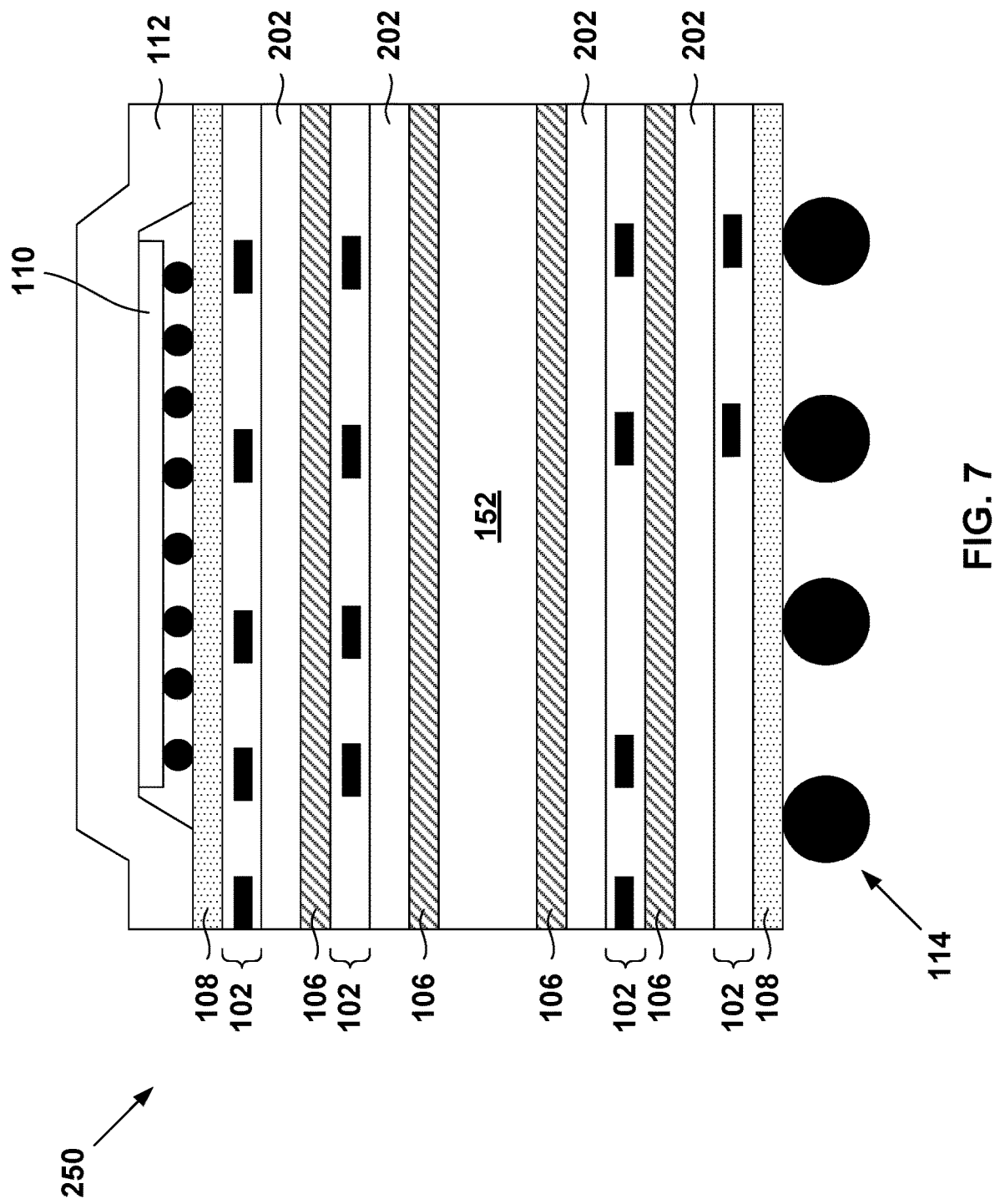
FIG. 7 illustrates the thin-core laminate structure including a high-modulus dielectric layer, according to an embodiment of the present disclosure.

It should be noted that selective patterning of the high-modulus dielectric layer 202 may also be conducted in a thin-core FCPBGA such as the thin-core laminate structure 150 depicted in FIG. 7. In such an instance, the process of patterning the high-modulus dielectric layer 202 may include similar steps and may be performed in a similar fashion as the high-modulus dielectric patterning process in coreless laminate structures described above.

According to another embodiment, the high-modulus dielectric layer 202 may include non-conductive nanofibers. By incorporating non-conductive nanofibers into a dielectric material, a reinforced dielectric matrix may be achieved to increase stiffness in a laminate structure.

The non-conductive nanofibers may be applied to any number of individual dielectric layers (also referred to as build-up layers) located between each of the wiring layers 102 and the power layers 106. Alternatively, the non-conductive nanofibers may be applied to either or both of the outermost dielectric layers of the coreless laminate structure 200, also referred to as solder mask layers 108. In this embodiment, the nanofiber-reinforced dielectric material may form the high-modulus dielectric layer 202. The added nanofibers may strengthen the dielectric matrix of the high-modulus dielectric layer 202 which may in consequence increase the stiffness of the coreless laminate structure 200. Additionally, the low CTE of the non-conductive nanofibers incorporated into the dielectric material forming the high-modulus dielectric layer 202 may reduce the composite CTE of the coreless laminate structure 200. The non-conductive nanofibers may be in contact with the wiring pattern.

The non-conductive nanofibers may include, but are not limited to, aramid, nylon, PET, polystyrene, or glass nanofibers. The nanofiber-reinforced high-modulus dielectric layer 202, may be patterned following the steps described above in order to create areas of mechanical reinforcement to counter stress forces that may result in laminate warpage.

It should be noted that the process of incorporating nanofibers to the high-modulus dielectric layer 202 may also be conducted in a thin-core FCPBGA such as the thin-core laminate structure 250 depicted in FIG. 7.

Therefore, the dimensional stability of a coreless or a thin-core laminate structure may be improved by selective patterning of conductive copper layers, selective patterning of a high-modulus dielectric layer, and/or by incorporating non-conductive nanofibers to a dielectric material to form a high-modulus dielectric layer. The resulting laminate structure may include a more dimensionally stable module that may be compatible with conventional bond and assembly processing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a conductive layer comprising a conductive material in a coreless laminate structure;
   selectively patterning the conductive layer to form a wiring pattern in the conductive layer;
   modifying the wiring pattern by adding or subtracting an amount of the conductive material in the wiring pattern according to a predetermined electrical design such that a coefficient of thermal expansion of the coreless laminate structure is modified to achieve a desired net stress in the coreless laminate structure;
   forming a dielectric layer comprising a nanofiber-reinforced dielectric material comprising non-conductive nanofibers in contact with the wiring pattern, wherein the dielectric layer has a low coefficient of thermal expansion and imaging properties, wherein the nanofiber-reinforced dielectric material comprises a photoimageable dielectric material; and
   selectively patterning the dielectric layer to remove portions of the dielectric layer from areas of the coreless laminate structure in which an effective stiffness is low, wherein remaining portions of the dielectric layer balance a differential stress caused by a density of the conductive material between the wiring pattern and the dielectric layer to mechanically stiffen the coreless laminate structure and reduce thermal warpage.

2. The method of claim 1, wherein the conductive layer comprises a power layer.

3. The method of claim 1, wherein the coreless laminate structure comprises at least one of the following: a coreless flip chip plastic ball grid package, or a thin-core flip chip plastic ball grid package.

4. A method comprising:
   forming a conductive layer comprising a conductive material in a coreless laminate structure;
   selectively patterning the conductive layer to form a wiring pattern in the conductive layer;
   modifying the wiring pattern by adding or subtracting an amount of the conductive material in the wiring pattern according to a predetermined electrical design such that a coefficient of thermal expansion of the coreless laminate structure is modified to achieve a desired net stress in the coreless laminate structure;
   forming a dielectric layer comprising a nanofiber-reinforced dielectric material comprising non-conductive nanofibers in contact with the wiring pattern, wherein the dielectric layer has a low coefficient of thermal expansion and imaging properties, wherein the nanofiber-reinforced dielectric material comprises a laser imageable dielectric material; and
   selectively patterning the dielectric layer to remove portions of the dielectric layer from areas of the coreless laminate structure in which an effective stiffness is low, wherein remaining portions of the dielectric layer balance a differential stress caused by a density of the conductive material between the wiring pattern and the dielectric layer to mechanically stiffen the coreless laminate structure and reduce thermal warpage.

5. The method of claim 4, wherein the conductive layer comprises a power layer.

6. The method of claim 4, wherein the coreless laminate structure comprises at least one of the following: a coreless flip chip plastic ball grid package, or a thin-core flip chip plastic ball grid package.

7. A method comprising:
   forming a conductive layer comprising a conductive material in a coreless laminate structure;
   selectively patterning the conductive layer to form a wiring pattern in the conductive layer;
   modifying the wiring pattern by adding or subtracting an amount of the conductive material in the wiring pattern according to a predetermined electrical design such that a coefficient of thermal expansion of the coreless laminate structure is modified to achieve a desired net stress in the coreless laminate structure;
   forming a dielectric layer comprising a nanofiber-reinforced dielectric material comprising non-conductive nanofibers in contact with the wiring pattern, wherein the dielectric layer has a low coefficient of thermal expansion and imaging properties, wherein the nanofiber-reinforced dielectric material comprises at least one of the following: aramid, nylon, PET, polystyrene, or glass nanofibers; and
   selectively patterning the dielectric layer to remove portions of the dielectric layer from areas of the coreless laminate structure in which an effective stiffness is low, wherein remaining portions of the dielectric layer balance a differential stress caused by a density of the conductive material between the wiring pattern and the dielectric layer to mechanically stiffen the coreless laminate structure and reduce thermal warpage.

8. The method of claim 7, wherein the conductive layer comprises a power layer.

9. The method of claim 7, wherein the coreless laminate structure comprises at least one of the following: a coreless flip chip plastic ball grid package, or a thin-core flip chip plastic ball grid package.

* * * * *